(12) United States Patent
Chuang et al.

(10) Patent No.: US 7,969,190 B2
(45) Date of Patent: Jun. 28, 2011

(54) INPUT STAGE FOR MIXED-VOLTAGE-TOLERANT BUFFER WITH REDUCED LEAKAGE

(76) Inventors: Che-Hao Chuang, Taipei (TW); Ming-Dou Ker, Hsinchu (TW)

(*) Notice: Subject to any disclaimer, the term of this patent is extended or adjusted under 35 U.S.C. 154(b) by 0 days.

(21) Appl. No.: 12/405,103

(22) Filed: Mar. 16, 2009

(65) Prior Publication Data
US 2009/0195269 A1    Aug. 6, 2009

Related U.S. Application Data

(62) Division of application No. 10/871,348, filed on Jun. 21, 2004, now Pat. No. 7,504,861.

(60) Provisional application No. 60/523,317, filed on Nov. 20, 2003.

(51) Int. Cl.
  *H03K 19/0175* (2006.01)
(52) U.S. Cl. .......................... 326/81; 326/68
(58) Field of Classification Search .............. 326/80–81, 326/68
  See application file for complete search history.

(56) References Cited

U.S. PATENT DOCUMENTS

| | | | |
|---|---|---|---|
| 4,825,106 A | 4/1989 | Tipon et al. | |
| 5,311,073 A | 5/1994 | Dallavalle | |
| 5,319,259 A | 6/1994 | Merrill | |
| 5,378,945 A | 1/1995 | Partovi et al. | |
| 5,495,185 A | 2/1996 | Goto | |
| 5,515,319 A | 5/1996 | Smayling et al. | |
| 5,521,531 A * | 5/1996 | Okuzumi | 326/81 |
| 5,541,534 A | 7/1996 | Cao et al. | |
| 5,646,809 A | 7/1997 | Motley et al. | |
| 5,663,659 A | 9/1997 | Kaminaga et al. | |
| 5,680,063 A * | 10/1997 | Ludwig et al. | 326/80 |
| 5,744,982 A | 4/1998 | Chu | |
| 5,867,010 A | 2/1999 | Hinedi et al. | |
| 5,880,605 A * | 3/1999 | McManus | 326/86 |
| 6,163,179 A * | 12/2000 | Huang et al. | 327/108 |
| 6,225,838 B1 | 5/2001 | Lee | |
| 6,255,850 B1 | 7/2001 | Turner | |

OTHER PUBLICATIONS

J. Williams, "Mixing 3V and 5V ICs," IEEE Spectrum, vol. 30, No. 3, pp. 40-42, Mar. 1993.
International Technology Roadmap for Semiconductors 2002 Update, Semiconductor Industry Association.
Sedra, Adel S., Microelectronic Circuits, 1998, Oxford University Press, pp. 366, 374-375.

* cited by examiner

*Primary Examiner* — James Cho

(57) ABSTRACT

A mixed-voltage buffer circuit coupled between a first circuit operative at a first power supply voltage and a second circuit operative at a second power supply voltage. The buffer circuit is connectable to the second power supply voltage and a third power supply voltage and includes an input circuit coupled to the first circuit through a first node and to the second circuit through a second node. The input circuit includes a first part coupled to the first node and an inverter coupled to the second node. The first part provides a signal having a voltage level approximately equal to the third power supply voltage to the inverter in response to a first signal on the first node, and provides a signal having a voltage level approximately equal to the second power supply voltage to the inverter in response to a second signal on the first node.

23 Claims, 4 Drawing Sheets

INPUT STAGE FOR MIXED-VOLTAGE-TOLERANT BUFFER WITH REDUCED LEAKAGE

This application is a divisional of U.S. application Ser. No. 10/871,348, filed Jun. 21, 2004 now U.S. Pat. No. 7,504,861, which claims priority under 35 U.S.C. §119(e)(1) to U.S. Provisional Application No. 60/523,317, filed Nov. 20, 2003, both of which are incorporated by reference herein in their entireties.

FIELD OF THE INVENTION

This invention relates in general to an input/output buffer circuit and, more particularly, to the input stage of a mixed-voltage-tolerant input/output buffer circuit.

BACKGROUND OF THE INVENTION

In a large electronic system having multiple sub-systems, such as in a computer system, there are generally a plurality of power supplies providing different voltage levels. The sub-systems, such as integrated circuits (ICs) and chips, often require such different power voltages. To protect the sub-systems from being damaged by the different power voltages, a mixed-voltage-tolerant input/output (I/O) buffer circuit is generally provided between the sub-systems.

Generally, in a system having a first circuit on a first chip and a second circuit on a second chip with an I/O buffer circuit coupled therebetween, the buffer circuit includes at least an input stage and an output stage. For purposes of the present description, it is assumed that a power supply of the first circuit has a higher voltage level than that of the second circuit, and the I/O buffer circuit operates at the same power supply level as that of the second circuit. For example, the first circuit may operate at 3.3V or 5V while the second circuit and the I/O buffer circuit both operate at 1.8V or 2.5V. It is also assumed that the input stage ("input circuit") of the buffer circuit receives one or more signals from the first circuit and outputs one or more signals to the second circuit, and that the output stage ("output circuit") of the buffer circuit receives one or more signals from the second circuit and outputs one or more signals to the first circuit.

FIG. 1 is a schematic of a conventional input circuit 100 of a mixed-voltage-tolerant I/O buffer circuit in the second chip. Input circuit 100 is coupled to a first circuit (not shown) through a node 102 and to a second circuit (not shown) through a node 104. The first circuit is powered at 3.3V, the second circuit is powered at 1.8V, and input circuit 100 is also powered at 1.8V. Input circuit 100 receives at least one signal from the first circuit at node 102 and outputs at least one signal to the second circuit at node 104. Input circuit 100 includes an NMOS transistor 106 and an inverter 108 serially coupled between nodes 102 and 104. NMOS transistor 106 has a gate (not numbered) coupled to a 1.8V power supply $V_{DD}$, a substrate (not numbered) coupled to ground, a source (not numbered) coupled to node 102, and a drain (not numbered) coupled to inverter 108. Inverter 108 includes a PMOS transistor 110 and an NMOS transistor 112, each having a gate (not numbered), a substrate (not numbered), a source (not numbered), and a drain (not numbered). The gates of PMOS transistor 110 and NMOS transistor 112 are coupled to each other and further coupled to the drain of NMOS transistor 106. The source of PMOS transistor 110 is coupled to $V_{DD}$. The source of NMOS transistor 112 is grounded. The drains of PMOS transistor 110 and NMOS transistor 112 are coupled to each other and further coupled to node 104.

An input signal at node 102 may have two possible logic values: 0, representing a voltage level of approximately 0V; and 1, representing a voltage level of approximately 3.3V. When the voltage of the signal at node 102 is 0V, NMOS transistor 106 is turned on and the input to inverter 108 is 0V. Inverter 108 then outputs a logic high signal to node 104, wherein the logic high signal has a voltage level of approximately 1.8V. If the voltage of the signal at node 102 is about 3.3V, the drain voltage of NMOS transistor 106 follows the gate voltage of NMOS transistor 106. Therefore, NMOS transistor 106 sends a logic high signal to the input terminal of inverter 108. Inverter 108 outputs a logic low, or 0V, signal to node 104.

A problem associated with input circuit 100 as illustrated in FIG. 1 is that, when the input signal at node 102 has a higher voltage level than $V_{DD}$, PMOS transistor 110 is not completely turned off, because the voltage at the drain of NMOS transistor 106 is approximately $V_{DD}$-$V_{th}$, rather than $V_{DD}$, wherein $V_{th}$ is the threshold voltage of NMOS transistor 106. Therefore, there exists a leakage current through inverter 108 from $V_{DD}$ to ground.

SUMMARY OF THE INVENTION

Accordingly, the present invention is directed to aspects of an input stage circuit of a mixed-voltage-tolerant I/O buffer circuit that obviate one or more of the problems due to limitations and disadvantages of the related art.

In accordance with the present invention, there is provided a buffer circuit for use in a mixed-voltage system, the mixed-voltage system including a first circuit operative at a first power supply voltage and a second circuit operative at a second power supply voltage, the buffer circuit for coupling between the first circuit and the second circuit and connectable to the second power supply voltage, all of the first circuit, the second circuit, and the buffer circuit also connectable to a third power supply voltage. The buffer circuit includes a first node connectable to the first circuit; a second node connectable to the second circuit; and an input stage circuit coupled between the first node and the second node to receive at least one signal from the first circuit at the first node and to provide at least one signal to the second circuit at the second node. The input circuit includes a first part coupled to the first node, and an inverter coupled between the first part and the second node, wherein the first part provides a signal having a voltage level approximately equal to the third power supply voltage to the inverter in response to a first signal on the first node, and provides a signal having a voltage level approximately equal to the second power supply voltage to the inverter in response to a second signal on the first node.

In accordance with the present invention, there is also provided a mixed-voltage system that includes a first circuit operative at a first power supply voltage; a second circuit operative at a second power supply voltage, wherein the first power supply voltage is higher than the second power supply voltage; and a buffer circuit coupled between the first circuit and the second circuit and connectable to the second power supply voltage. The buffer circuit includes a first node coupled to the first circuit, a second node coupled to the second circuit, an input stage circuit coupled between the first node and the second node to receive at least one signal from the first circuit at the first node and to provide at least one signal to the second circuit at the second node, and an output stage circuit coupled between the first node and the second node to receive at least one signal from the second circuit at the second node and to provide at least one signal to the first circuit at the first node. The input circuit includes a first part coupled to the first node, and an inverter coupled between the first part and the second node, wherein the first part provides a signal having a voltage level of approximately 0V to the inverter in response to a first signal on the first node, and provides a signal having a voltage level approximately equal to the second power supply voltage to the inverter in response to a second signal on the first node.

In accordance with the present invention, there is still provided a buffer circuit for use in a mixed-voltage system, the mixed-voltage system including a first circuit operative at a first power supply voltage and a second circuit operative at a second power supply voltage, the buffer circuit for coupling between the first circuit and the second circuit and connectable to the second power supply voltage, all of the first circuit, the second circuit, and the buffer circuit also connectable to a third power supply voltage. The buffer circuit includes a first node connectable to the first circuit; a second node connectable to the second circuit; and an input stage circuit coupled between the first node and the second node to receive at least one signal from the first circuit at the first node and to provide at least one signal to the second circuit at the second node. The input circuit includes a first NMOS transistor coupled to the first node, a first inverter coupled to the first NMOS transistor, a second inverter coupled between the first inverter and the second node, and a first PMOS transistor coupled to the first inverter and connectable to the second power supply voltage, wherein the first PMOS transistor has a substrate, a gate, a source, and a drain, the gate of the first PMOS transistor being coupled to the second node.

In accordance with the present invention, there is further provided a mixed-voltage system that includes a first circuit operative at a first power supply voltage; a second circuit operative at a second power supply voltage, wherein the first power supply voltage is higher than the second power supply voltage; and a buffer circuit coupled between the first circuit and the second circuit and connectable to the second power supply voltage. The buffer circuit includes a first node connectable to the first circuit, a second node connectable to the second circuit, an input stage circuit coupled between the first node and the second node to receive at least one signal from the first circuit at the first node and to provide at least one signal to the second circuit at the second node, and an output stage circuit coupled between the first node and the second node to receive at least one signal from the second circuit at the second node and to provide at least one signal to the first circuit at the first node. The input circuit including a first NMOS transistor coupled to the first node, a first inverter coupled to the first NMOS transistor, a second inverter coupled between the first inverter and the second node, a first PMOS transistor coupled to the first inverter and connectable to the second power supply voltage, wherein the first PMOS transistor has a substrate, a gate, a source, and a drain, the gate of the first PMOS transistor being coupled to the second node, and the drain of the first PMOS transistor being coupled to the first inverter, and a diode having a positive terminal and a negative terminal, the negative terminal of the diode being coupled to the first node, and the positive terminal being coupled to the second node.

Also in accordance with the present invention, there is provided a buffer circuit for use in a mixed-voltage system, the mixed-voltage system including a first circuit operative at a first power supply voltage and a second circuit operative at a second power supply voltage, the buffer circuit for coupling between the first circuit and the second circuit and connectable to the second power supply voltage, all of the first circuit, the second circuit, and the buffer circuit also connectable to a third power supply voltage. The buffer circuit includes a first node connectable to the first circuit; a second node connectable to the second circuit; and an input stage circuit coupled between the first node and the second node to receive at least one signal from the first circuit at the first node and to provide at least one signal to the second circuit at the second node. The input circuit includes a first part coupled to the first node, and an inverter having a first input terminal, a second input terminal, and an output terminal, wherein the first and second input terminals are coupled to the first part, and the output terminal is coupled to the second node, wherein the first part provides a first signal to the first input terminal of the inverter in response to a logic high signal on the first node, and provides a second signal to the second input terminal of the inverter in response to a logic low signal on the second node.

Still in accordance with the present invention, there is provided a mixed-voltage system that includes a first circuit operative at a first power supply voltage, a second circuit operative at a second power supply voltage, wherein the first power supply voltage is higher than the second power supply voltage, and a buffer circuit coupled between the first circuit and the second circuit and connectable to the second power supply voltage and a third power supply voltage. The buffer circuit includes a first node connectable to the first circuit, a second node connectable to the second circuit, an input stage circuit coupled between the first node and the second node to receive at least one signal from the first circuit at the first node and to provide at least one signal to the second circuit at the second node. The input circuit including a first part coupled to the first node, and an inverter having a first input terminal, a second input terminal, and an output terminal, wherein the first and second input terminals are coupled to the first part, and the output terminal is coupled to the second node, wherein the first part provides a first signal to the first input terminal of the inverter and a second signal to the second input terminal of the inverter in response to a logic high signal on the first node, and provides a third signal to the first input terminal of the inverter and a fourth signal to the second input terminal of the inverter in response to a logic low signal on the second node, wherein the logic high signal has a voltage level approximately equal to the first power supply voltage and the logic low signal has a voltage level approximately equal to the third power supply voltage.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the features, advantages, and principles of the invention.

In the drawings.

DESCRIPTION OF THE EMBODIMENTS

Reference will now be made in detail to embodiments of the present invention, examples of which are illustrated in the accompanying drawings. Wherever possible, the same reference numbers will be used throughout the drawings to refer to the same or like parts.

The present invention provides an input stage circuit (input circuit) of an I/O buffer circuit used in a mixed-voltage system, wherein the input stage circuit does not have the problem of leakage current associated with conventional input circuit 100 as discussed above.

For illustrative purposes, it is assumed that the mixed-voltage system described herein includes a first circuit on a first chip and a second circuit on a second chip, with the I/O buffer circuit coupled therebetween. The I/O buffer circuit includes at least the input stage circuit which receives one or more signals from the first circuit and outputs one or more signals to the second circuit, and an output stage circuit which receives one or more signals from the second circuit and outputs one or more signals to the first circuit. For the convenience of explaining the present invention and without limitation on the scope of the present invention, it is also assumed that the first circuit is connectable to a first power supply voltage of 3.3V, and the second circuit and the I/O buffer circuit are both connectable to a second power supply $V_{DD}$ of 1.8V. Alternatively, the first and second power supply voltages may also be 5V and 2.5V, respectively, or any other pair of voltages encountered in integrated circuit applications. All of the first circuit, the second circuit, and the I/O buffer circuit are also connectable to a third power supply voltage $V_{SS}$. In one aspect, $V_{SS}$ is ground. It is also assumed that, in a circuit operative at two power supply voltages, a logic high signal in a circuit has a voltage level approximately equal to a more positive one of the two power supply voltages, and a logic low signal has a voltage level approximately equal to a more negative one of the two power supply voltages. Thus, for example, if the I/O buffer circuit is connectable to $V_{DD}$ and $V_{SS}$, wherein $V_{DD}$ is 1.8V and $V_{SS}$ is ground, a logic high signal in the I/O buffer circuit would have a voltage level approximately equal to $V_{DD}$, while a logic low signal in the I/O buffer circuit would have a voltage level approximately equal to ground.

Figure 1:
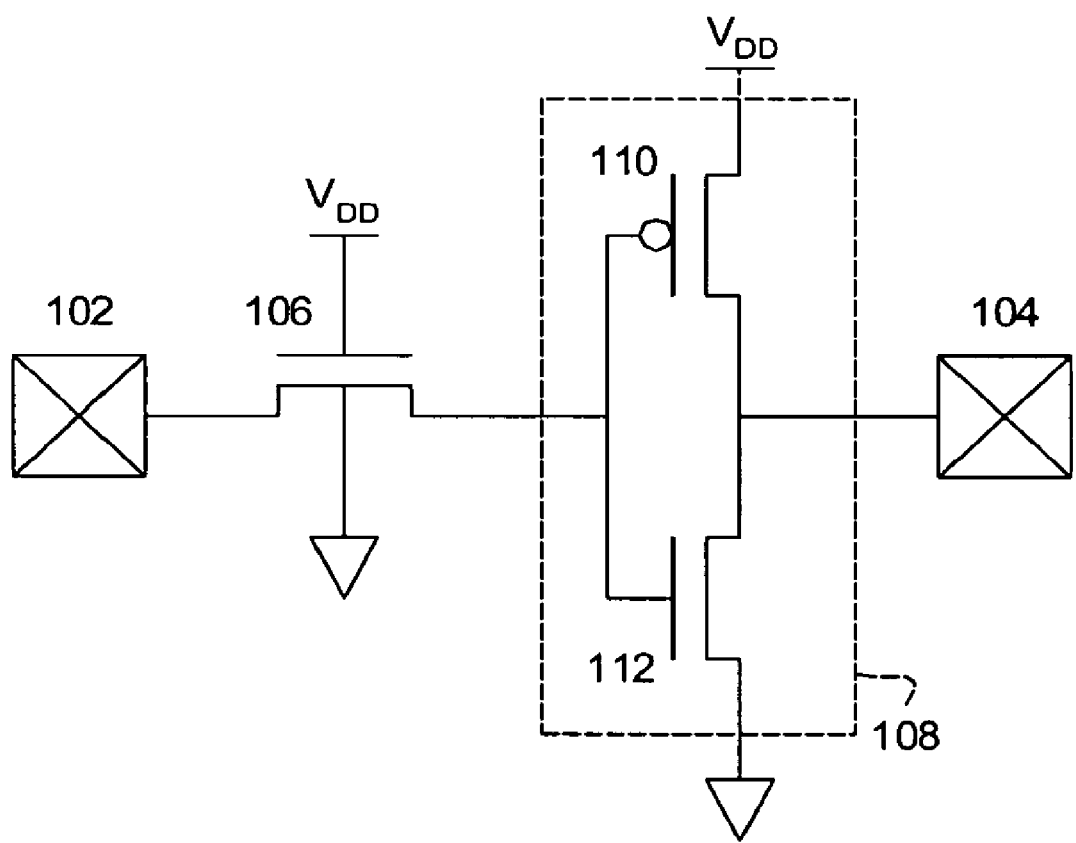
FIG. 1 illustrates a conventional input circuit of a mixed-voltage-tolerant I/O buffer circuit.
Figure 2:
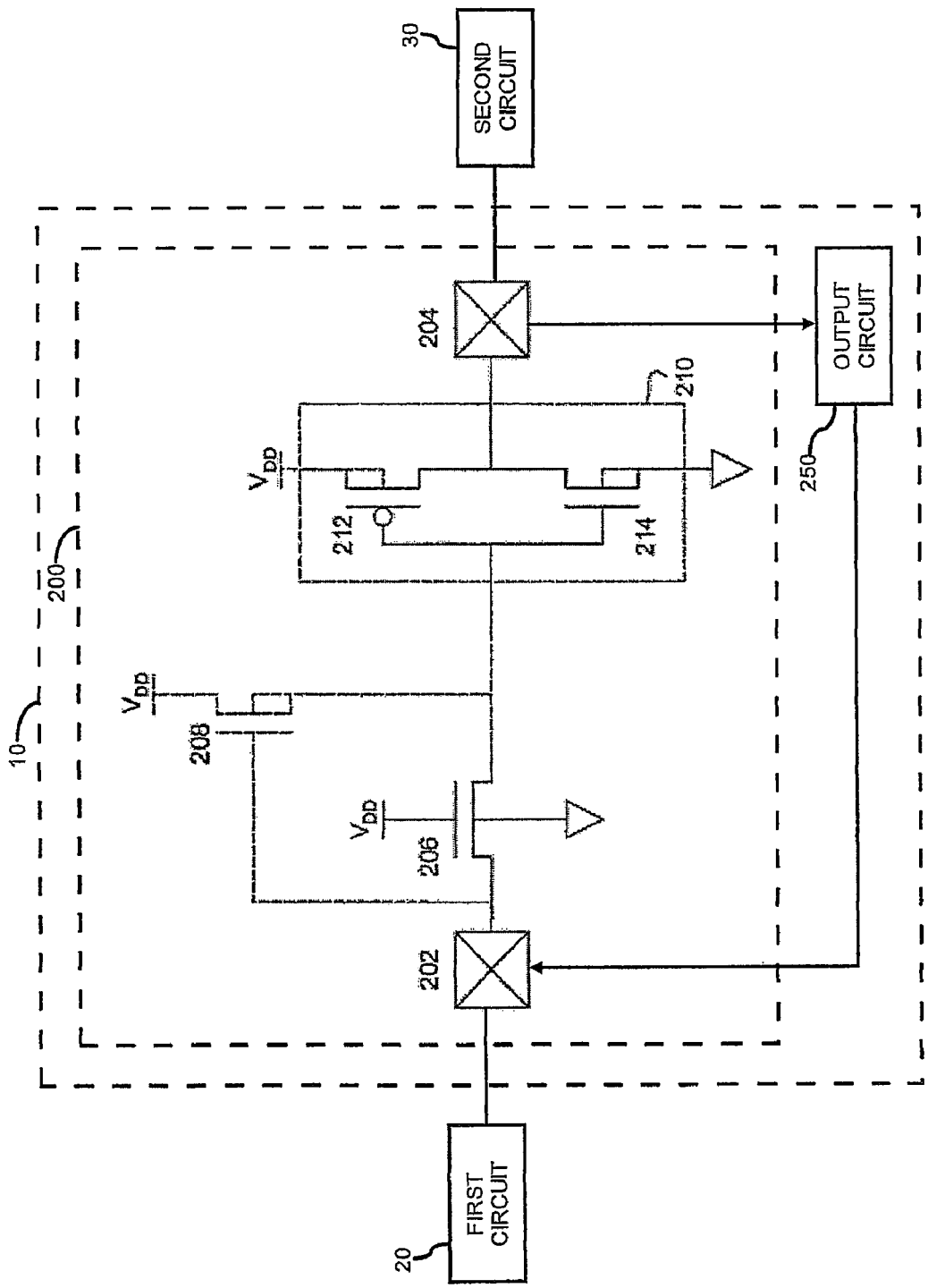
FIG. 2 illustrates an input circuit of a mixed-voltage I/O buffer circuit consistent with a first embodiment of the present invention.

FIG. 2 illustrates a mixed-voltage I/O buffer circuit 10 including an input circuit 200 consistent with a first embodiment of the present invention. Referring to FIG. 2, I/O buffer circuit 10 is coupled between a first circuit 20 and a second circuit 30. In one aspect, I/O buffer circuit 10 may also include an output circuit 250. Both input circuit 200 and output circuit 250 are coupled to first circuit 20 through a node 202 and to second circuit 30 through a node 204. Input circuit 200 receives one or more signals from first circuit 20 at node 202 and provides one or more signals to second circuit 30 at node 204. Output circuit 250 receives one or more signals from second circuit 30 at node 204 and provides one or more signals to first circuit 20 at node 202. Output circuit 250 may be implemented as any conventional output circuit suitable for use in a mixed-voltage I/O buffer and therefore is not described in detailed herein. Details of input circuit 200 are discussed below.

Referring again to FIG. 2, input circuit 200 includes two NMOS transistors 206 and 208 and an inverter 210. Inverter 210 includes a PMOS transistor 212 and an NMOS transistor 214. Each of transistors 206, 208, 212, 214 has a substrate (not numbered), a gate (not numbered), a source (not numbered), and a drain (not numbered). The gates of PMOS transistor 212 and NMOS transistor 214 are coupled to each other to form an input terminal of inverter 210. The drains of PMOS transistor 212 and NMOS transistor 214 are coupled to each other to form an output terminal of inverter 210. The substrate of NMOS transistors 206 is connectable to $V_{SS}$. The gate of NMOS transistor 206 is connectable to $V_{DD}$. The source of NMOS transistor 206 is coupled to both node 202 and the gate of NMOS transistor 208. The drain of NMOS transistor 206 is coupled to the drain of NMOS transistor 208 and the input terminal of inverter 210. The source of NMOS transistor 208 is connectable to $V_{DD}$. Both the substrate and the source of PMOS transistor 212 are connectable to $V_{DD}$. Both the substrate and the source of NMOS transistor 214 are connectable to $V_{SS}$. The output terminal of inverter 210 is coupled to node 204.

It is to be understood that a MOS transistor is generally symmetrical and therefore the source and drain of the MOS transistors in the circuit configurations described herein are interchangeable.

Also, in a buffer circuit, inverters are commonly used to boost the driving power of the buffer circuit. One skilled in the art would appreciate that any number of inverters may generally be used in a buffer circuit or the input circuit of a buffer circuit. Although an output signal may be inverted or differ in phase between buffer circuits using different numbers of inverters, such a phase difference should not affect the functions of the input circuits consistent with the present invention.

A signal received at node 202 may have two possible logic values: 0, representing a voltage level of approximately 0V; and 1, representing a voltage level of approximately 3.3V.

When the signal at node 202 has a voltage level of 0V, NMOS transistor 206 is turned on, and the input to inverter 210 is 0V. Thus, the output at node 204 is approximately equal to $V_{DD}$, or 1.8V.

When the signal at node 202 has a voltage level of 3.3V, NMOS transistor 208 is turned on because of the positive junction bias between the gate and source thereof. Therefore, the gates of PMOS transistor 212 and NMOS transistor 214 are both biased at $V_{DD}$. PMOS transistor 212 is completely turned off, NMOS transistor 214 is turned on, and the output at node 204 is approximately 0V. Clearly, there is no leakage current between $V_{DD}$ and $V_{SS}$ through inverter 210, because PMOS transistor 212 is completely turned off.

In one aspect, to avoid gate oxide overstress on NMOS transistor 208, the substrate of NMOS transistor 208 is coupled to the source thereof, and also to the gates of PMOS transistor 212 and NMOS transistor 214. In this configuration, the potential drop across the gate oxide of NMOS transistor 208 is approximately 1.5V when signal at node 202 is 3.3V, or approximately 1.8V when signal at node 202 is 0V. NMOS transistor 208 according to the first embodiment may be formed by first forming a deep N-well in a semiconductor substrate by ion implantation of n-type dopants, then forming a p-well in the deep N-well, followed by conventional processing steps to form an NMOS transistor having a source and a substrate coupled to each other. NMOS transistor 208 thus formed may be referred to as a deep N-well transistor. Transistors 206, 212, and 214 may be formed by conventional processing methods.

Figure 3:
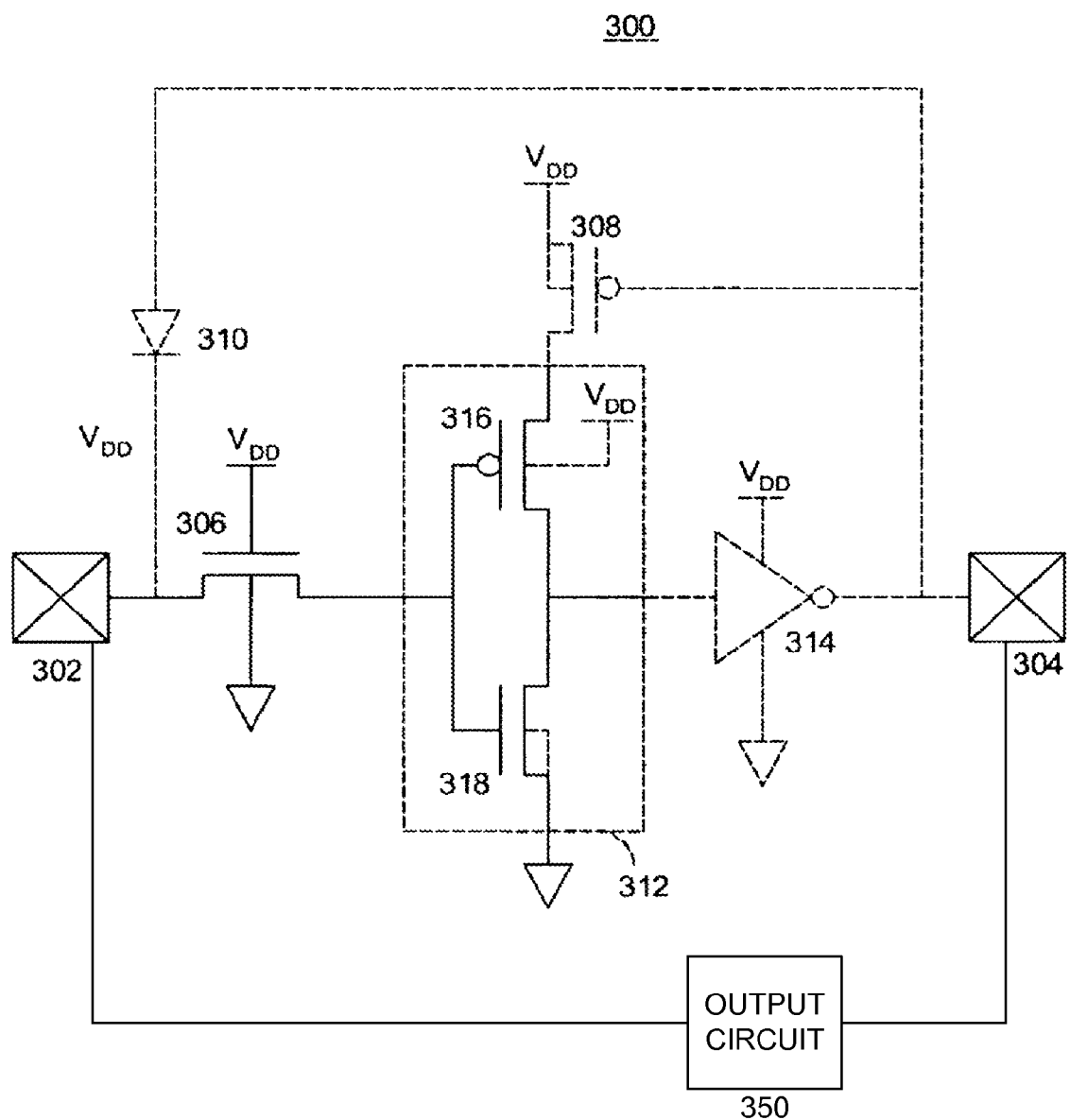
FIG. 3 illustrates an input circuit of a mixed-voltage I/O buffer circuit consistent with a second embodiment of the present invention.

FIG. 3 illustrates an input circuit 300 of a mixed-voltage I/O buffer circuit (not numbered) consistent with a second embodiment of the present invention. Similarly, the I/O buffer circuit is coupled to a first circuit and a second circuit. The I/O buffer circuit may also include an output circuit coupled between the first and second circuits. However, to simplify illustration, the first circuit and second circuit are not shown in FIG. 3 and are not described herein.

Referring to FIG. 3, input circuit 300 is coupled between two nodes 302 and 304, wherein node 302 is coupled to receive a signal from the first circuit (not shown) and node 304 is coupled to provide a signal to the second circuit (not shown). Output circuit 350 may be coupled between node 302 and node 304. Input circuit 300 includes an NMOS transistor 306, a PMOS transistor 308, a diode 310, and two inverters 312 and 314. Inverter 312 includes a PMOS transistor 316 and an NMOS transistor 318. Each of transistors 306, 308, 316, 318 has a substrate (not numbered), a gate (not numbered), a source (not numbered), and a drain (not numbered). Diode 310 has a positive terminal and a negative terminal. Each of inverters 312 and 314 has an input terminal and an output terminal. The gates of PMOS transistor 316 and NMOS transistor 318 are coupled to each other to form the input terminal of inverter 312. The drains of PMOS transistor 316 and NMOS transistor 318 are coupled to each other to form the output terminal of inverter 312. The substrate of NMOS transistor 306 is connectable to $V_{SS}$. The gate of NMOS transistor 306 is connectable to $V_{DD}$. The source of NMOS transistor 306 is coupled to both node 302 and the negative terminal of diode 310. The drain of NMOS transistor 306 is coupled to the input terminal of inverter 312. The source and substrate of PMOS transistor 308 are both connectable to $V_{DD}$. The gate of PMOS transistor 308 is coupled to node 304, the output terminal of inverter 314, and the positive terminal of diode 310. The drain of PMOS transistor 308 is coupled to the source of PMOS transistor 316. The substrate of PMOS transistor 316 is connectable to $V_{DD}$. The substrate and source of NMOS transistor 318 are both connectable to $V_{SS}$. The output terminal of inverter 312 is coupled to the input terminal of inverter 314.

If a signal received at node 302 has a voltage level of approximately 0V, NMOS transistor 306 is turned on and outputs a signal of 0V to inverter 312. The gate voltage of PMOS transistor 308 is approximately equal to a potential drop on diode 310, $V_{diode}$, which is, for example, 0.5V for a silicon diode. Therefore, PMOS transistor 308 is turned on to provide a power supply of approximately $V_{DD}$ to inverter 312, and inverter 312 outputs a signal of approximately 1.8V to inverter 314. Thus, the output at node 304 is approximately 0V.

If the signal received at node 302 is 3.3V, the voltage at the input terminal of inverter 312 follows the gate voltage of NMOS transistor 306, and is approximately $V_{DD}$-$V_{th}$, wherein $V_{th}$ is the threshold voltage of NMOS transistor 306. Therefore, NMOS transistor 318 is turned on and outputs a signal of approximately 0V to inverter 314. The output at node 304 is thus approximately 1.8V. Since the gate of PMOS transistor 308 is coupled to the output terminal of inverter 314, and is therefore biased at 1.8V, PMOS transistor 308 is completely turned off. Accordingly, there is no leakage current from $V_{DD}$ to $V_{SS}$ through inverter 312 because such a leakage path is blocked by the turned-off PMOS transistor 308.

Figure 4:
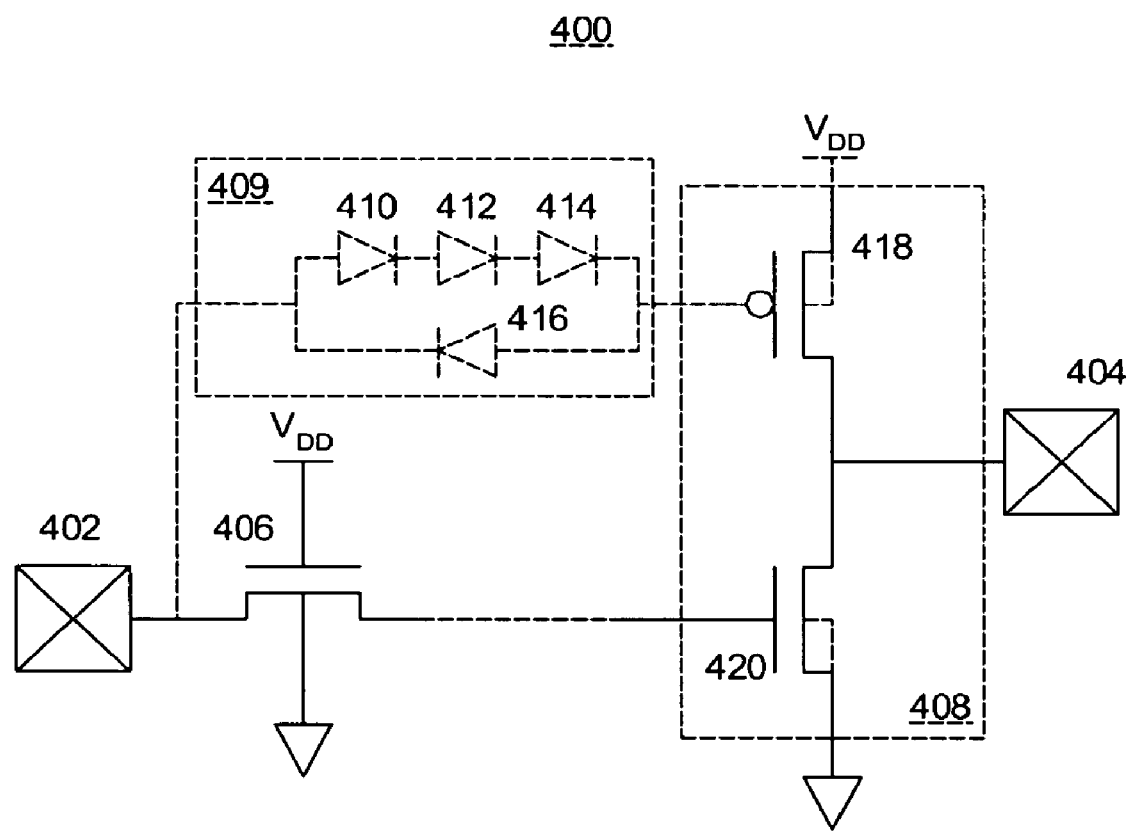
FIG. 4 illustrates an input circuit of a mixed-voltage I/O buffer circuit consistent with a third embodiment of the present invention.

A third embodiment of the present invention is illustrated in FIG. 4, which shows an input circuit 400 of a mixed-voltage I/O buffer circuit (not numbered). Similarly, the I/O buffer circuit is coupled to a first circuit and a second circuit. The I/O buffer circuit may also include an output circuit coupled between the first and second circuits. However, to simplify illustration, the first circuit, second circuit, and the output circuit are not shown in FIG. 4 and are not described herein.

Referring to FIG. 4, input circuit 400 is coupled between nodes 402 and 404, wherein node 402 is coupled to receive a signal from the first circuit (not shown) and node 404 is coupled to provide a signal to the second circuit (not shown). Input circuit 400 includes an NMOS transistor 406, an inverter 408, and a diode string 409 including four diodes 410, 412, 414, and 416. Inverter 408 further includes a PMOS transistor 418 and an NMOS transistor 420.

Each of transistors 406, 418, and 420 has a substrate (not numbered), a gate (not numbered), a source (not numbered), and a drain (not numbered). The substrate of NMOS transistors 406 is connectable to $V_{SS}$. The gate of NMOS transistor 406 is connectable to $V_{DD}$. The source of NMOS transistor 406 is coupled to node 402. The drain of NMOS transistor 406 is coupled to the gate of NMOS transistor 420. The source and substrate of PMOS transistor 418 are both connectable to $V_{DD}$. The drain of PMOS transistor 418 is coupled to the drain of NMOS transistor 420, and is further coupled to node 404. The substrate and source of NMOS transistor 420 are both connectable to $V_{SS}$.

Each of diodes 410, 412, 414, and 416 has a positive terminal and a negative terminal. Diodes 410, 412, and 414 are connected in series with the positive terminal of one diode coupled to the negative terminal of a previous diode. The positive terminal of diode 410 is further coupled to the negative terminal of diode 416 and the source of NMOS transistor 406. The negative terminal of diode 414 is coupled to the positive terminal of diode 416 and the gate of PMOS transistor 418.

When node 402 receives a signal from the first circuit with a voltage of 0V, NMOS transistor 406 is turned on. The gate of NMOS transistor 420 is biased at 0V and NMOS transistor 420 is turned off. On the other hand, the bias at the gate of PMOS transistor 418 is approximately equal to a voltage drop across diode 416, $V_{diode}$, which is, for example, 0.5V for a silicon-based diode. Thus, PMOS transistor 418 is turned on to provide a voltage of approximately 1.8V to node 404.

When the signal at node 402 is 3.3V, the gate voltage of NMOS transistor 420 follows the gate voltage of transistor 406, which is $V_{DD}$, and is approximately $V_{DD}$-$V_{th}$, wherein $V_{th}$ is the threshold voltage of NMOS transistor 406. Thus, NMOS transistor 420 is turned on and provides a signal having a voltage level of approximately 0V to node 404. At the same time, the gate voltage of PMOS transistor 418 is approximately 3.3V-3·$V_{diode}$. Assuming $V_{diode}$ is 0.5V for a silicon diode, the gate of PMOS transistor 418 is biased at approximately 1.8V. The bias across the junction between the gate and the source of PMOS transistor 418 is therefore less than the threshold of a PMOS transistor. Thus, PMOS transistor 418 is completely turned off, and no leakage current exists through inverter 408. Also, since the gate voltage of PMOS transistor 418 is approximately equal to $V_{DD}$, there is no problem of gate oxide overstress.

In the above-discussed third embodiment of the present invention, there are three serially-connected diodes, i.e., diodes 410, 412, and 414. However, it is to be understood that the number of serially-connected diodes implemented is not limited to three. One skilled in the art would be able to determine how many diodes should be used, taking into account the power supply voltages of the first circuit and the I/O buffer circuit ($V_{DD}$), the threshold voltage of the PMOS transistor 418, the material of the substrate on which input circuit 400 is fabricated, etc.

It will be apparent to those skilled in the art that various modifications and variations can be made in the disclosed structures and methods without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A buffer circuit comprising:
    a first node configured to be connected to a first circuit, wherein the first circuit is configured to operate at a first power supply voltage;
    a second node configured to be connected to a second circuit, wherein the second circuit is configured to operate at a second power supply voltage;
        an input stage circuit coupled between the first node and the second node, wherein the input stage circuit is configured to receive at least one signal from the first circuit at the first node and to provide at least one signal to the second circuit at the second node, and wherein the input stage circuit includes:
        a first NMOS transistor coupled to the first node;
        a first inverter coupled to the first NMOS transistor;
        a second inverter coupled between the first inverter and the second node; and
        a first PMOS transistor coupled to the first inverter, wherein the first PMOS transistor is configured to be connected to the second power supply voltage, wherein the first PMOS transistor includes a gate coupled to the second node; and
    a diode having a positive terminal and a negative terminal, wherein the negative terminal is coupled to the first node and the positive terminal is coupled to the second node;
    wherein the first circuit, the second circuit, and the buffer circuit are configured to be connected to a third power supply voltage.

2. The buffer circuit of claim 1, wherein the first power supply voltage is higher than the second power supply voltage, wherein the second power supply voltage is higher than the third power supply voltage, and wherein the third power supply voltage is ground.

3. The buffer circuit of claim 1, wherein the first inverter includes a second PMOS transistor and a second NMOS transistor, wherein each of the first and second NMOS transistors and the second PMOS transistor have a substrate, a gate, a source, and a drain, wherein the gates of the second PMOS transistor and the second NMOS transistor are coupled to each other and to the drain of the first NMOS transistor, wherein the drains of the second PMOS transistor and the second NMOS transistor are coupled to each other and to an input of the second inverter, wherein the source of the second PMOS transistor is coupled to a drain of the first PMOS transistor, and wherein the source and substrate of the second NMOS transistor are configured to be connected to the third power supply voltage.

4. The buffer circuit of claim 1, further comprising an output stage circuit coupled between the first node and the second node, wherein the output stage circuit is configured to receive at least one signal from the second circuit at the second node and to provide at least one signal to the first circuit at the first node.

5. The buffer circuit of claim 1, wherein the first NMOS transistor has a substrate, a gate, a source, and a drain, and wherein the source of the first NMOS transistor is coupled to the first node.

6. The buffer circuit of claim 1, wherein the first NMOS transistor has a substrate, a gate, a source, and a drain, and wherein the drain of the first NMOS transistor is coupled to an input terminal of the first inverter.

7. The buffer circuit of claim 1, wherein the first inverter includes a second PMOS transistor and a second NMOS transistor, wherein each of the first and second NMOS transistors and the second PMOS transistor have a substrate, a gate, a source, and a drain, and wherein the gates of the second PMOS transistor and the second NMOS transistor are coupled to each other and to the drain of the first NMOS transistor.

8. The buffer circuit of claim 1, wherein the first inverter includes a second PMOS transistor and a second NMOS transistor, wherein the second NMOS transistor and the second PMOS transistor each have a substrate, a gate, a source, and a drain, and wherein the drains of the second PMOS transistor and the second NMOS transistor are coupled to each other and to an input of the second inverter.

9. The buffer circuit of claim 1, wherein the first inverter includes a second PMOS transistor and a second NMOS transistor, wherein the second PMOS transistor has a substrate, a gate, a source, and a drain, and wherein the source of the second PMOS transistor is coupled to a drain of the first PMOS transistor.

10. The buffer circuit of claim 1, wherein the first inverter includes a second PMOS transistor and a second NMOS transistor, wherein the second NMOS transistor has a substrate, a gate, a source, and a drain, and wherein the source and substrate of the second NMOS transistor are configured to be connected to the third power supply voltage.

11. The buffer circuit of claim 1, wherein the gate of the first PMOS transistor is coupled to an output terminal of the second inverter.

12. The buffer circuit of claim 1, wherein the first power supply voltage is higher than the second power supply voltage, wherein the second power supply voltage is higher than the third power supply voltage, and wherein the third power supply voltage is ground.

13. A buffer circuit, the buffer circuit comprising:
    a first node configured to be connected to a first circuit, wherein the first circuit is configured to operate at a first power supply voltage;
    a second node configured to be connected to a second circuit, wherein the second circuit is configured to operate at a second power supply voltage;
    an input stage circuit coupled between the first node and the second node, wherein the input stage circuit is configured to receive at least one signal from the first circuit at the first node and to provide at least one signal to the second circuit at the second node, wherein the input stage circuit includes:
        a first NMOS transistor coupled to the first node;
        a first inverter coupled to the first NMOS transistor;
        a second inverter coupled between the first inverter and the second node; and
        a first PMOS transistor coupled to the first inverter, wherein the first PMOS transistor is configured to be connected to the second power supply voltage, wherein the first PMOS transistor includes a gate coupled to the second node; and
    an output stage circuit coupled between the first node and the second node, wherein the output stage circuit is configured to receive at least one signal from the second circuit at the second node and to provide at least one signal to the first circuit at the first node;

wherein the first circuit, the second circuit, and the buffer circuit are configured to be connected to a third power supply voltage.

14. The buffer circuit of claim 13, wherein the first NMOS transistor has a substrate, a gate, a source, and a drain, and wherein the source of the first NMOS transistor is coupled to the first node.

15. The buffer circuit of claim 13, wherein the first inverter includes a second PMOS transistor and a second NMOS transistor, wherein each of the first and second NMOS transistors and the second PMOS transistor have a substrate, a gate, a source, and a drain, and wherein the gates of the second PMOS transistor and the second NMOS transistor are coupled to each other and to the drain of the first NMOS transistor.

16. The buffer circuit of claim 13, wherein the first inverter includes a second PMOS transistor and a second NMOS transistor, wherein the second NMOS transistor has a substrate, a gate, a source, and a drain, and wherein the source and substrate of the second NMOS transistor are configured to be connected to the third power supply voltage.

17. A buffer circuit, the buffer circuit comprising:
    a first node configured to be connected to a first circuit, wherein the first circuit is configured to operate at a first power supply voltage;
    a second node configured to be connected to a second circuit, wherein the second circuit is configured to operate at a second power supply voltage; and
    an input stage circuit coupled between the first node and the second node, wherein the input stage circuit is configured to receive at least one signal from the first circuit at the first node and to provide at least one signal to the second circuit at the second node, wherein the input stage circuit includes:
        a first inverter that includes a first PMOS transistor and a first NMOS transistor, wherein the first NMOS transistor has a substrate, a gate, a source, and a drain, and wherein the source and substrate of the first NMOS transistor are configured to be connected to a third power supply voltage;
        a second NMOS transistor coupled to the first node and the first inverter;
        a second inverter coupled between the first inverter and the second node; and
        a second PMOS transistor coupled to the first inverter, wherein the second PMOS transistor is configured to be connected to the second power supply voltage, wherein the second PMOS transistor includes a gate coupled to the second node;

wherein the first circuit, the second circuit, and the buffer circuit are configured to be connected to the third power supply voltage.

18. The buffer circuit of claim 17, wherein each of the second NMOS transistor and the first PMOS transistor have a substrate, a gate, a source, and a drain, and wherein the gates of the first PMOS transistor and the first NMOS transistor are coupled to each other and to the drain of the second NMOS transistor.

19. The buffer circuit of claim 17, wherein the first PMOS transistor has a substrate, a gate, a source, and a drain, and wherein the source of the first PMOS transistor is coupled to a drain of the second PMOS transistor.

20. The buffer circuit of claim 17, wherein the first PMOS transistor has a substrate, a gate, a source, and a drain, and wherein the drains of the first PMOS transistor and the first NMOS transistor are coupled to each other and to an input of a second inverter.

21. The buffer circuit of claim 17, wherein the first power supply voltage is higher than the second power supply voltage, wherein the second power supply voltage is higher than the third power supply voltage, and wherein the third power supply voltage is ground.

22. A buffer circuit comprising:
    a first node configured to be connected to a first circuit, wherein the first circuit is configured to operate at a first power supply voltage;
    a second node configured to be connected to a second circuit, wherein the second circuit is configured to operate at a second power supply voltage;
    an input stage circuit coupled between the first node and the second node, wherein the input stage circuit is configured to receive at least one signal from the first circuit at the first node and to provide at least one signal to the second circuit at the second node;
    a diode having a positive terminal and a negative terminal, wherein the negative terminal is coupled to the first node and the positive terminal is coupled to the second node; and
    an output stage circuit coupled between the first node and the second node, wherein the output stage circuit is configured to receive at least one signal from the second circuit at the second node and to provide at least one signal to the first circuit at the first node;

wherein the first circuit, the second circuit, and the buffer circuit are configured to be connected to a third power supply voltage.

23. The buffer circuit of claim 22, wherein the first power supply voltage is higher than the second power supply voltage, wherein the second power supply voltage is higher than the third power supply voltage, and wherein the third power supply voltage is ground.

* * * * *

UNITED STATES PATENT AND TRADEMARK OFFICE
CERTIFICATE OF CORRECTION

| | | |
|---|---|---|
| PATENT NO. | : 7,969,190 B2 | Page 1 of 1 |
| APPLICATION NO. | : 12/405103 | |
| DATED | : June 28, 2011 | |
| INVENTOR(S) | : Chuang et al. | |

It is certified that error appears in the above-identified patent and that said Letters Patent is hereby corrected as shown below:

Column 1, line 4, below Title insert -- CROSS-REFERENCE TO RELATED APPLICATION --.

Signed and Sealed this

Eighteenth Day of October, 2011

David J. Kappos
*Director of the United States Patent and Trademark Office*